United States Patent [19]

O'Connell et al.

[11] 4,200,510
[45] Apr. 29, 1980

[54] ASSEMBLY AND METHOD TO EXTEND USEFUL LIFE OF SPUTTERING TARGETS

[75] Inventors: Lawrence E. O'Connell, Doylestown; George F. Nichols, Springtown, both of Pa.

[73] Assignee: Delbar Products, Inc., Perkasie, Pa.

[21] Appl. No.: 21,410

[22] Filed: Mar. 19, 1979

[51] Int. Cl.² .............................................. C23C 15/00
[52] U.S. Cl. .................................. 204/192 R; 204/298
[58] Field of Search ............................ 204/192 R, 298

[56] References Cited

U.S. PATENT DOCUMENTS

| 4,100,055 | 7/1978 | Rainey | 204/298 |
| 4,116,806 | 9/1978 | Love et al. | 204/298 |

*Primary Examiner*—Aaron Weisstuch

*Attorney, Agent, or Firm*—Reising, Ethington, Barnard, Perry & Brooks

[57] ABSTRACT

A planar magnetron cathode target assembly is formed from a plurality of individual target tiles arranged in end-to-end abutting relationship so as to form a continuous and enclosed length of consumable metal. In use, the individual targets are eroded so as to define a continuous annular track or trough having a curved V-shape or double-convex cross section with the deepest part of the trough being generally intermediate the width of each target tile. At this time, each target tile in the longitudinal rows is severed along the deepest part of the trough and reassembled with the thickest or least eroded parts of the several target segments in transversely abutting relationship. Each of the end tiles is also rotated 180° to position its non-eroded portion in abutting relationship with the endmost severed and reassembled targets.

10 Claims, 9 Drawing Figures

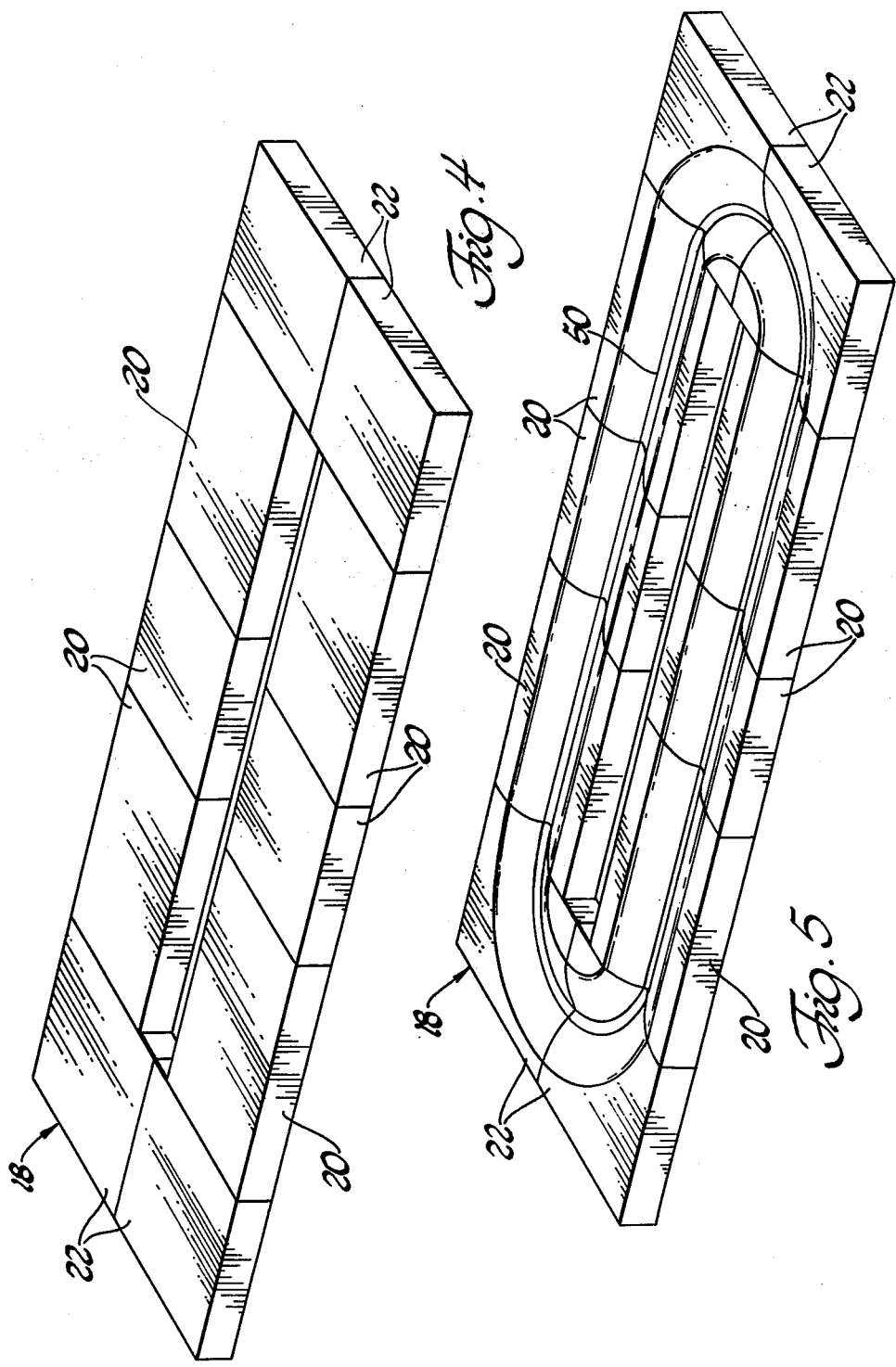

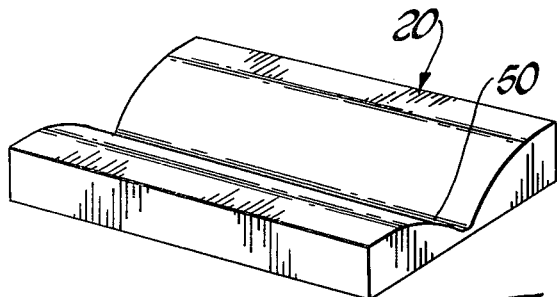
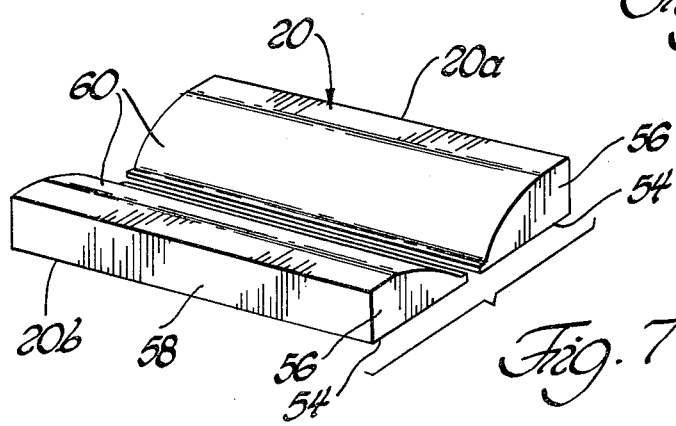
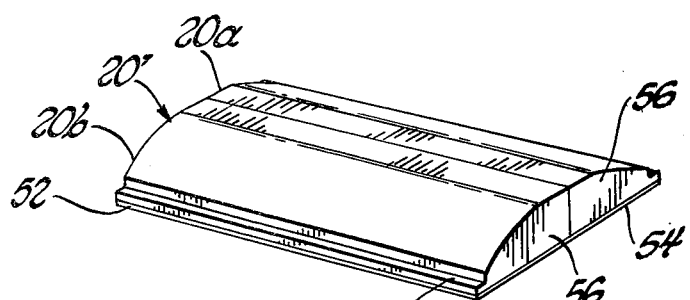
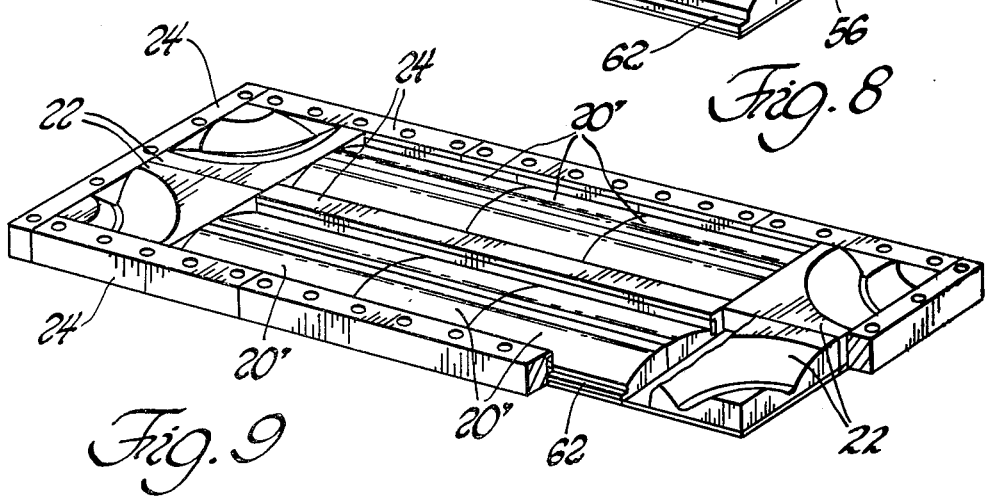

ASSEMBLY AND METHOD TO EXTEND USEFUL LIFE OF SPUTTERING TARGETS

TECHNICAL FIELD

The present invention relates to a consumable metal cathode assembly and a method of fabricating such an assembly from the partially consumed components of a cathode assembly.

The consumable cathode assembly of the invention is of the type used to sputter or vapor deposit the metal of the cathode as a thin film upon a suitable substrate material such as another metal, glass, plastic or the like. The mechanism in which the cathode assembly is incorporated may be of the type known as a Planar Magnetron wherein the cathode is disposed in a vacuum chamber into which a non-oxidizing gas, such as argon, is introduced. A magnetic field is generated across the cathode assembly to which a sufficient negative voltage is applied to ionize the impel the gas atoms against the cathode, causing the metal thereof to be vaporized and, in turn, to be deposited as a film on a substrate positioned proximate to the cathode assembly.

BACKGROUND ART

In the process of thus depositing the cathode metal upon the substrate, a trough is eroded in the cathode assembly and which trough corresponds to the enclosed or annular shape of the magnetic field generated by the Planar Magnetron mechanism. Once the depth of the trough extends through the original thickness of the metal cathode, it is necessary to replace the cathode assembly even though only a portion of the cathode volume has been consumed. Heretofore, such cathode assemblies must be replaced when only between 20% and 30% of the cathode metal has been consumed.

By way of example, the cost of a typical rectangular cathode assembly made of pure chromium and being 12" wide × 29" long and having a thickness of 1" is in the range of $6,500. As noted, in the past such assembly had to be replaced even though 70% to 80% of the cathode volume is unconsumed. From a user's viewpoint, such low volumetric yield is undesirable and progressively more so as more costly cathode materials, such as gold, platinum, silver or palladium, are used in the sputtering or vapor deposition process.

It is the purpose of the present invention to greatly increase the useful life of a consumable cathode assembly used in the sputtering or vapor deposition process by reorienting the unconsumed metal volume of the assembly so as to be available for deposition without replacement of the original cathode assembly components. More specifically, the present invention relates to a consumable cathode assembly and a method for making such which, in general, doubles the volume of metal cathode material available for deposition and, therefore, reduces the consumable metal cost generally by one-half.

As noted, one type of deposition mechanism in which the consumable metal cathode assembly of the present invention is utilized is referred to as a Planar Magnetron. The mechanism includes a consumable metal cathode disposed in a vacuum chamber into which a non-oxidizing gas, such as argon, is introduced and within which chamber a substrate material is located for the deposition thereon of a thin film of the cathode metal. An annular magnetic coil is positioned immediately behind the cathode assembly. The magnetic coil is energized to generate a closed loop magnetic field across the cathode material. The magnetic field ionizes the non-oxidizing gas and accelerates the charged atoms thereof within the magnetic field, causing such atoms to collide with and thereby vaporize the surface of the cathode metal within the vacuum chamber. The vaporized cathode metal is propelled linearly away from the cathode assembly and condenses as an evenly distributed film on the proximately disposed substrate material.

The area of erosion of the cathode assembly both in width and length corresponds generally to the annular magnetic field with the width being defined by the magnetic field lines across the cathode assembly generally parallel to the surface thereof. The depth of the erosion into the cathode is determined by the current density across the cathode and over a period of time; this creates an eroded trough having a curved V-shape or double-convex cross section. At such time as the bottom of the eroded trough approaches the original thickness of the cathode, it is necessary to replace the cathode assembly even though only 20% to 30% of the cathode volume has been consumed. In other words, less than ⅓ of the original cathode volume is consumed at the time replacement has heretofore been necessary.

With the present invention, the cathode assembly is formed of a plurality of individual target tiles arranged in end-to-end abutting relationship so as to form a continuous and enclosed length of consumable metal. More specifically, the individual target tiles include two pairs of end targets transversely connecting two longitudinal rows of abutting targets altogether forming a closed and continuous loop of consumable metal overlaying the generated magnetic field. In use, the individual targets are eroded so as to define a continuous annular track or trough having a curved V-shape or double-convex cross section with the deepest part of the trough being generally intermediate the width of each target tile. The continuous and annular eroded trough includes linear or straight sections formed through the two longitudinal tile rows and curved or arcuate sections formed through the end tiles.

At such time as the deepest part of the trough approaches the original thickness of the target tiles, the cathode assembly must be replaced. In accordance with the invention, each target tile of the longitudinal rows is severed along the deepest part of the trough and reassembled with the thickest or least eroded parts of the severed target segments in transversely abutting relationship. At the same time, each of the four end tiles is rotated through 180° upon its base to position the non-eroded portion thereof in abutting relationship with the endmost severed and reassembled targets. The severed, reassembled and rotated tiles thus form a new cathode assembly wherein the thickest or least eroded parts of each target tile are reoriented, in effect, to fill in the volume of the eroded trough to provide a new and continuous closed length of non-eroded cathode metal. In this manner the useful life of the consumable cathode assembly is doubled, reducing generally by one-half the replacement cost of such assembly.

The details of the invention are set forth in the drawings and following description.

BRIEF DESCRIPTION OF DRAWINGS

FIG. 4 is a perspective view of a new and uneroded cathode assembly;

FIG. 5 is a cathode assembly with an eroded annular trough formed therein;

FIGS. 6 and 7 show an eroded longitudinal tile target before and after being severed;

FIG. 8 shows a severed and reassembled longitudinal target tile; and

FIG. 9 shows a reoriented and reassembled cathode assembly.

BEST MODE FOR CARRYING OUT THE INVENTION

Figure 1:
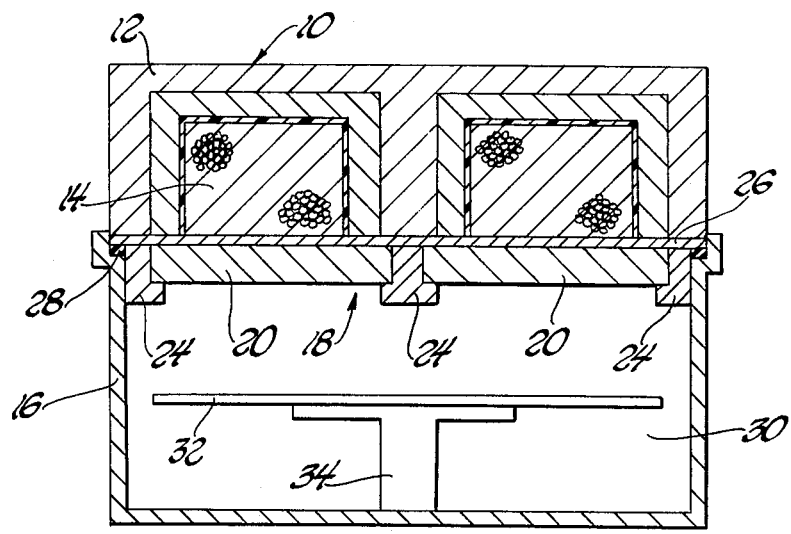
FIGS. 1 and 2 are schematic representations of a Planar Magnetron mechanism embodying the cathode assembly of the present invention.

A Planar Magnetron mechanism 10 is schematically shown in FIG. 1 and is an example of the type of energy generating mechanism with which the metal cathode assembly of the present invention may be used. The Magnetron mechanism includes a first housing 12 within which an annular type magnetic coil 14 is mounted. Due to the heat generated thereby, magnetic coil 14 and gasket 26 are suitably cooled by the circulation of water therethrough. A second housing 16 is suitably secured to upper housing 12. A metal cathode assembly is indicated generally at 18 and includes a plurality of consumable metal target tiles 20 and 22 suitably secured to the upper housing 12 through suitable clamping members 24. Copper gasket or plate 26 is disposed between targets 20 and 22, clamping devices 24 and the upper housing member 12. Housing 16 is also recessed about its upper periphery to receive an O-ring sealing member 28 which abuts against the outer edge of copper gasket 26. Upper housing 12 and lower housing 16 define a vacuum chamber 30 within which a substrate member 32 is suitably disposed upon a support structure 34. Substrate 32, the upper face of which is to be coated with a thin film of metal eroded and projected from target tiles 20 and 22, is generally located within 4" to 6" of the lower face of the target tiles.

Figure 2:
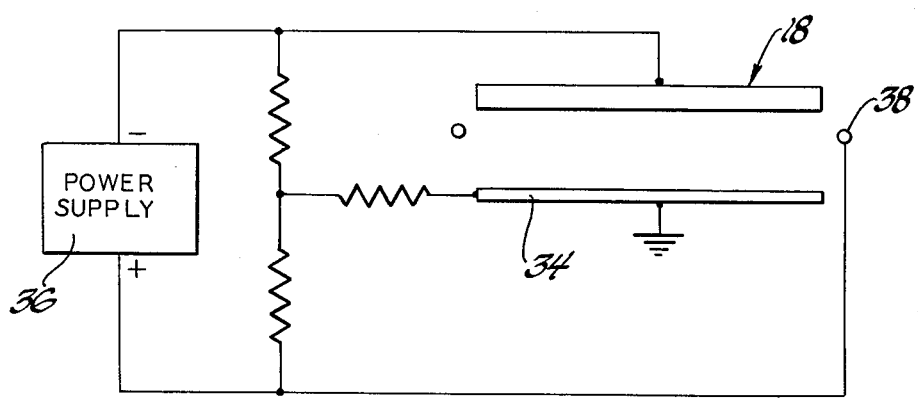

FIG. 2 is a schematic representation of an electrical system utilized with the Planar Magnetron. As indicated to FIG. 2, the cathode assembly 18 is connected to the negative side of a power supply 36 the positive side of which is connected to an anode 38 while a substrate supporting means 34 is connected through a parallel resistance circuit to ground. Anode 38 is positioned proximate the cathode assembly 18 and is utilized to prevent high currents from bombarding the substrate 32 and causing excessive heating or damage. This arrangement nulls the current to ground and hence to the substrate. Thus, the main contribution to the heat seen by substrate 32 is only that due to the vapor condensation of the metal film deposited thereon from the tiles 20 and 22. By way of example, soft plastic substrates have been coated in this manner without deformation.

Figure 3:
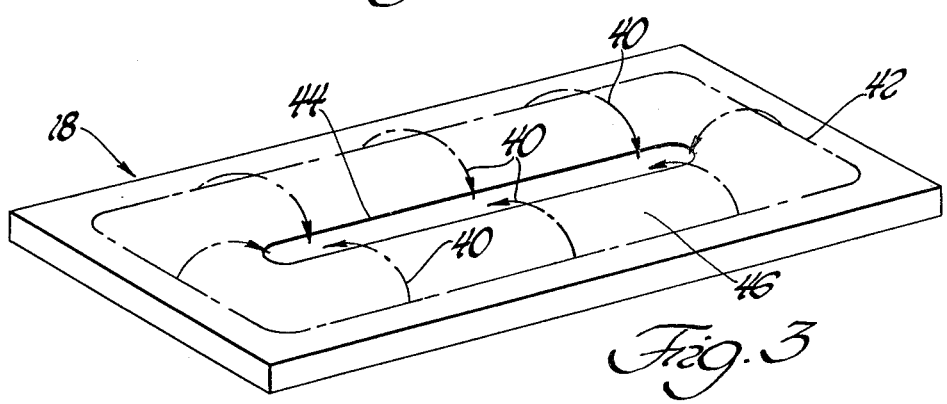
FIG. 3 is a schematic view of the magnetic field induced in the cathode assembly of the invention.

FIG. 3 is a schematic representation of the annular magnetic field generated by magnetic coil 14 through the cathode assembly 18. In FIG. 3, the magnetic field lines are indicated at 40 and the line of exit of said magnetic field lines from the cathode member is indicated at 42 while the line of reentry of such magnetic field lines is indicated at 44. The area of erosion of the cathode is indicated at 46 and is in the form of an annular continuous area corresponding in shape to that of magnetic coil 14. Upper casing 12 is also a magnetic pole piece to direct the magnetic field at 42 and 44.

FIG. 4 depicts a new and uneroded cathode assembly 18 with the target tiles 20 and 22 arrayed in end-to-end abutting relationship for mounting within Magnetron mechanism 10.

FIG. 5 shows a spent or eroded cathode assembly depicting the manner in which the target tiles are eroded, resulting in an annular trough 50 having a generally curved V-shape or double-convex cross section. An individual longitudinal eroded tile 20 is shown in FIG. 6. The transverse path of erosion of targets 20 and 22 corresponds generally to the increased current density caused by the magnetic field as generated by magnetic coil 14 with progressively greater erosion occurring at the center of the magnetic field.

The sputtering or vapor deposition of the consumable metal targets within the Magnetron device 10 will now be generally described. Chamber 30 is placed under a vacuum of approximately $1 \times 10^{-4}$ torr. With this vacuum established, chamber 30 is then filled with 1–5 microns of a non-oxidizing gas such as argon. A voltage is then applied between the cathode assembly 18 and anode 38 which sets up a glow discharge in front of the target tiles 20 and 22. For example, the cathode potential is approximately 400–700 volts with a current of 6 to 36 amperes in coil 14. The foregoing creates an annular magnetic field of approximately 200 to 300 gauss above the area of erosion 46 of the targets 20 and 22. With these conditions, the argon atoms are ionized. However, the argon ions become trapped in the magnetic field and are accelerated therewithin and impelled against the exposed surface of the target tiles, causing the surface of the latter to be vaporized. The vaporized metal particles from the target materials are propelled away from the target and strike the upper face of substrate 32 and are condensed thereon as a thin film.

In view of the location of anode 38, high currents are prevented from bombarding the substrate 32 which could otherwise cause excessive heating and damage to certain substrate materials. Thus, the main contribution to substrate heating is due to vapor condensation of the metal from the target tiles 20 and 22. Thus, substrate 32 sees very low temperatures in the nature of a few hundred degrees F. By way of example, the subject mechanism has been used to coat soft plastics with up to 2,000 Angstroms of metal in 15 seconds without deformation.

An important utilization of the subject mechanism is to coat chromium on a glass substrate to provide a thin reflective film on the glass surface and thereby provide a mirror element.

Referring again to FIG. 5, when the eroded annular trough 50 in target tiles 20 and 22 reaches the depth approaching the original thickness of the target, it has heretofore been necessary to replace such cathode assembly. However, in this case generally only between 20% and 30% of the volume of the cathode target tiles have been consumed. In other words, between 70% and 80% of the cathode target tiles are unconsumed or unused at the time replacement has been necessary in the past.

The present invention is concerned with a cathode assembly and the method for fabricating such which enables the useful life of the cathode assembly to be doubled or, in other words, enables 40% to 60% of the cathode metal to be consumed before a new cathode assembly is required.

The foregoing is achieved by initially forming the cathode assembly of a plurality of end-to-end abutting and individual tile members 20 and 22 which together form an enclosed and continuous metal surface as shown in FIG. 4. FIG. 4 represents a cathode assembly before it has been used. In general, the overall shape of the cathode assembly corresponds to the shape of magnetic coil 14. By way of example, the cathode assembly shown in FIG. 4 has a width of approximately 12", and overall length of 29" with each tile having a thickness of approximately 1". For ease of assembly and mounting, the individual target tiles are mounted to upper housing 12 through suitable clamping members 24.

As noted, FIG. 5 shows a cathode assembly after its first period of use and showing the essentially fully eroded trough 50 through the various tile members and in which erosion has proceeded to the point where the cathode assembly must be changed.

Rather than replace the entire cathode assembly as has been necessary in the past when only between 20% and 30% of the volume of the cathode has been consumed, the present invention enables the target tiles to be reoriented and reassembled to provide, in effect, a new cathode assembly out of the partially consumed assembly. Accordingly, and as best seen in FIGS. 6 through 9, each of the longitudinal tiles 20 is removed from the assembly and severed along the length of the deepest part of the trough so as to provide two discrete target elements 20a and 20b. Each target element includes a planar bottom surface 54, planar end surfaces 56, a planar side surface 58 generally normal to bottom surface 54 and end surfaces 56, and a convex upper surface 60 extending from the upper edge of side surface 58 and terminating proximate bottom surface 54.

After being severed, elements 20a and 20b are reversed and reassembled, as seen in FIG. 8, to form a new target element 20'. For ease of handling and reassembly into a new cathode assembly, target elements 20a and 20b may be secured, as through screws not shown, to a copper plate 52. With the target elements reassembled, side surfaces 58 are in abutting relationship disposing the thickest portions thereof at the transverse middle of the new target 20'. As reassembled, new target 20' has a generally symmetrical and continuous convex upper surface.

To facilitate mounting the reoriented cathode assembly upon upper housing 12 by clamping members 24, it is normally desirable to machine or otherwise form a flat outer longitudinal edge or lip 62 on tiles 20'. The coaction between tile lips 62 and clamping members 24 is best seen in the broken-away sectional view at the lower right corner of FIG. 9.

To complete the reorientation of the cathode assembly and as best seen in FIG. 9, the end tiles 22 are rotated through 180° about their planar bottom surfaces so as to present the major uneroded portion thereof in abutting relationship to the endmost of the longitudinal tiles 20'. The severed and reassembled longitudinal tiles 20' and the rotated end tiles 22 are shown in FIG. 9 as reassembled to provide, in essence, a new cathode assembly.

In this manner, the individual tile elements have been severed, reassembled, and rotated so as to, in effect, replace the previously eroded trough of the original assembly with the uneroded portions of the partially consumed targets.

It is apparent that in the manner taught by the present invention, the useful life of a cathode assembly is essentially doubled and the cost of replacing such assembly reduced by one-half. Inasmuch as the sputtering or vapor deposition process is frequently used to deposit thin films of relatively costly metals and which metals must be used in a very pure form, the cost savings realized by the present invention are significant. As noted, a pure chromium cathode assembly having dimensions of 12" in width by 24" in length and of 1" thickness is approximately $6,500. To double the useful life of such an assembly is obviously a significant cost savings in the manufacture of products using such sputtering process. It is further apparent that with the use of even more exotic metals such as gold, silver, and palladium, the coating cost savings are even greater.

It is apparent that other variations are possible within the intended scope of the invention as set forth in the hereinafter appended claims.

What is claimed is:

1. A metal cathode assembly including a conductive metal base plate, a plurality of consumable metal target members mounted upon said base plate, said target members being arrayed on said base plate to include two sets of longitudinally spaced end targets and a plurality of intermediate end-to-end abutting targets disposed between said end targets, said abutting targets coacting to provide an enclosed and continuous length of consumable metal, each intermediate target comprising a pair of elements, each element having a pair of planar end surfaces, a planar bottom surface and at least one planar side surface extending generally normal to said end and bottom surfaces, each element also including a convex upper surface extending transversely from the upper edge of said side surface and terminating proximate said bottom surface, means securing each pair of elements to the base plate to dispose the planar side surfaces in abutting relationship whereby each intermediate target has a generally symmetrical and continuous convex upper surface.

2. A metal cathode assembly including a conductive metal base plate, a plurality of consumable metal target members mounted upon said base plate, said target members being arrayed on said base plate to include two sets of longitudinally spaced end targets and a plurality of intermediate end-to-end abutting targets disposed between said end targets, said abutting targets coacting to provide an enclosed and continuous length of consumable metal, each intermediate target comprising a pair of elements, each element having a pair of planar end surfaces, a planar bottom surface and at least one planar side surface extending generally normal to said end and bottom surfaces, a lip extending longitudinally of each element intermediate said end surfaces and transversely spaced from said side surface, each element also including a convex upper surface extending transversely from the upper edge of said side surface and terminating proximate said lip, means securing each pair of elements to the base plate to dispose the planar side surfaces in abutting relationship whereby each intermediate target has a generally symmetrical and continuous convex upper surface terminating at its transverse outer edges at said lips.

3. A metal cathode assembly including a conductive metal base plate, a plurality of consumable metal target members mounted upon said base plate, said target members being arrayed on said base plate to include two sets of longitudinally spaced end targets and a plurality of intermediate end-to-end abutting targets disposed between said end targets, said abutting targets coacting to provide an enclosed and continuous length of consumable metal, each intermediate target comprising a pair of elements, each element having a pair of planar end surfaces, a planar bottom surface and at least one planar side surface extending generally normal to said end and bottom surfaces, a lip extending longitudinally of each element intermediate said end surfaces and transversely spaced from said side surface, each element also including a convex upper surface extending transversely from the upper edge of said side surface and terminating proximate said lip, clamping means coacting with said lips to secure each pair of elements to the base plate and to dispose the planar side surfaces in abutting relationship whereby each intermediate target has a generally symmetrical and continuous convex upper surface.

4. A metal cathode assembly including a conductive metal base plate, a plurality of consumable metal target members mounted upon said base plate, said target members being arrayed on said base plate to include two sets of longitudinally spaced end targets and a plurality of intermediate end-to-end abutting targets disposed between said end targets, said abutting targets coacting to provide an enclosed and continuous length of consumable metal, each intermediate target comprising a pair of elements, each element having a pair of planar end surfaces, a planar bottom surface and at least one planar side surface extending generally normal to said end and bottom surfaces, each element also including a convex upper surface extending transversely from the upper edge of said side surface and terminating proximate said bottom surface, means securing each pair of elements to the base plate to dispose the planar side surfaces in abutting relationship whereby each intermediate target has a generally symmetrical and continuous convex upper surface, said intermediate targets being arranged on said base plate to provide two parallel and transversely spaced rows of targets wherein the planar end surfaces of adjacent targets are in abutting relationship, the end targets abutting against the planar end surfaces of the endmost intermediate targets to transversely join said target rows to provide a closed and continuous path of consumable metal.

5. A metal cathode assembly including a conductive metal base plate, a plurality of consumable metal target members mounted upon said base plate, said target members being arrayed on said base plate to include two sets of longitudinally spaced end targets and a plurality of intermediate end-to-end abutting targets disposed between said end targets, said abutting targets coacting to provide an enclosed and continuous length of consumable metal, each intermediate target comprising a pair of elements, each element having a pair of planar end surfaces, a planar bottom surface and at least one planar side surface extending generally normal to said end and bottom surfaces, a lip extending longitudinally of each element intermediate said end surfaces and transversely spaced from said side surface, each element also including a convex upper surface extending transversely from the upper edge of said side surface and terminating proximate said lip, means securing each pair of elements to the base plate to dispose the planar side surfaces in abutting relationship whereby each intermediate target has a generally symmetrical and continuous convex upper surface terminating at its transverse outer edges at said lips, said intermediate targets being arranged on said base plate to provide two parallel and transversely spaced rows of targets wherein the planar end surfaces of adjacent targets are in abutting relationship, the end targets abutting against the planar end surfaces of the endmost intermediate targets to transversely join said target rows to provide a closed and continuous path of consumable metal.

6. A metal cathode assembly including a conductive metal base plate, a plurality of consumable metal target members mounted upon said base plate, said target members being arrayed on said base plate to include two sets of longitudinally spaced end targets and a plurality of intermediate end-to-end abutting targets disposed between said end targets, said abutting targets coacting to provide an enclosed and continuous length of consumable metal, each intermediate target comprising a pair of elements, each element having a pair of planar end surfaces, a planar bottom surface and at least one planar side surface extending generally normal to said end and bottom surfaces, a lip extending longitudinally of each element intermediate said end surfaces and transversely spaced from said side surface, each element also including a convex upper surface extending transversely from the upper edge of said side surface and terminating proximate said bottom surface, clamping means coacting with said lips to secure each pair of elements to the base plate and to dispose the planar side surfaces in abutting relationship whereby each intermediate target has a generally symmetrical and continuous convex upper surface, said intermediate targets being arranged on said base plate to provide two parallel and transversely spaced rows of targets wherein the planar end surfaces of adjacent targets are in abutting relationship, the end targets abutting against the planar end surfaces of the endmost intermediate targets to transversely join said target rows to provide a closed and continuous path of consumable metal.

7. A metal cathode assembly including a conductive metal base plate, a plurality of consumable metal target members mounted upon said base plate, said target members being arrayed on said base plate to include two pairs of longitudinally spaced end targets and a plurality of intermediate end-to-end abutting targets disposed between said end targets, said abutting targets coacting to provide an enclosed and continuous length of consumable metal, each intermediate target comprising a pair of elements, each element having a pair of planar end surfaces, a planar bottom surface and at least one planar side surface extending generally normal to said end and bottom surfaces, a lip extending longitudinally of each element intermediate said end surfaces and transversely spaced from said side surface, each element also including a convex upper surface extending transversely from the upper edge of said side surface and terminating proximate said bottom surface, clamping means coacting with said lips to secure each pair of elements to the base plate and to dispose the planar side surfaces in abutting relationship whereby each intermediate target has a generally symmetrical and continuous convex upper surface terminating at its transverse outer edges at said lips, said intermediate targets being arranged on said base plate to provide two parallel and transversely spaced rows of targets wherein the planar end surfaces of adjacent targets are in abutting relationship, the end targets abutting against the planar end surfaces of the endmost intermediate targets to transversely join said target rows to provide a closed and continuous path of consumable metal.

8. The method of restoring a partially consumed metal cathode assembly of the type comprising a plurality of initially solid and rectangularly shaped metal targets mounted in abutting relationship on a conductive base plate so as to form an enclosed and continuous length of consumable metal, said assembly comprising two sets of end targets transversely joining two rows of aligned and abutting intermediate targets, the assembly having been eroded in use to result in a continuous oval-like narrow groove extending through said targets, the groove in the intermediate target rows being linear and of a double convex configuration in cross section with the deepest part of the groove being generally midway of the width of the intermediate targets, the groove in said end targets also being of a double convex section and curved to join the linear groove portions, the method comprising: disconnecting said targets from said base plate, severing each intermediate target along the deepest part of said groove to form a pair of target elements, reversing and reattaching said target elements to said base plate so that the thickest portions of said elements are in abutting contact thereby providing each target with a generally symmetrical and continuous convex upper surface, and rotating each end target through 180° upon its base to position the thickest portions thereof in abutting relationship to the endmost intermediate targets whereby the thickest portions of said severed and repositioned targets are disposed in the area formerly occupied by said eroded groove.

9. The method of restoring a partially consumed metal cathode assembly of the type comprising a plurality of initially solid and rectangularly shaped metal targets mounted in abutting relationship on a conductive base plate so as to form an enclosed and continuous length of consumable metal, said assembly comprising two sets of end targets transversely joining two rows of aligned and abutting intermediate targets, the assembly having been eroded in use to result in a continuous oval-like narrow groove extending through said targets, the groove in the intermediate target rows being linear and of a double convex configuration in cross section with the deepest part of the groove being generally midway of the width of the intermediate targets, the groove in said end targets also being of a double convex section and curved to join the linear groove portions, the method comprising: disconnecting said targets from said base plate, severing each intermediate target along the deepest part of said groove to form a pair of target elements, forming a longitudinally extending lip adjacent the deepest part of the reversing groove area on each element, and reattaching said target elements to said base plate so that the thickest portions of said elements are in abutting contact thereby providing each target with a generally symmetrical and continuous convex upper surface terminating at the outwardly disposed lips, and rotating each end target through 180° upon its base to position the thickest portions thereof in abutting relationship to the endmost intermediate targets whereby the thickest portions of said severed and repositioned targets are disposed in the area formerly occupied by said eroded groove.

10. The method of restoring a partially consumed metal cathode assembly of the type comprising a plurality of initially solid and rectangularly shaped metal targets mounted in abutting relationship on a conductive base plate so as to form an enclosed and continuous length of consumable metal, said assembly comprising two sets of end targets transversely joining two rows of aligned and abutting intermediate targets, the assembly having been eroded in use to result in a continuous oval-like narrow groove extending through said targets, the groove in the intermediate target rows being linear and of a double convex configuration in cross section with the deepest part of the groove being generally midway of the width of the intermediate targets, the groove in said end targets also being of a double convex section and curved to join the linear groove portions, the method comprising: disconnecting said targets from said base plate, severing each intermediate target along the deepest part of said groove to form a pair of target elements, forming a longitudinally extending lip adjacent the deepest part of the groove area on each element, reversing and mounting each pair of target elements upon a support plate so that the thickest portions of said elements are in abutting contact and the lips transversely spaced thereby providing a target having a generally symmetrical and continuous convex upper surface, aligning said severed and reversed intermediate targets into two parallel and longitudinally target rows, rotating each end target through 180° upon its base to position the uneroded portions thereof in abutting relationship to the endmost intermediate targets, remounting said severed and repositioned targets upon the base plate whereby the thickest portions of said targets are disposed in the area formerly occupied by said eroded groove.

* * * * *